United States Patent
Kobayashi et al.

(10) Patent No.: US 7,527,083 B2
(45) Date of Patent: May 5, 2009

(54) APPARATUS FOR ADJUSTING GAP WIDTH OF LAMINATED BODY

(75) Inventors: Takeshi Kobayashi, Kusatsu (JP);
Fumiaki Kunimoto, Hikone (JP);
Nobuo Shimizu, Shiga-ken (JP)

(73) Assignee: Au Optronics Corporation, Hsinchu (TW)

( * ) Notice: Subject to any disclaimer, the term of this patent is extended or adjusted under 35 U.S.C. 154(b) by 393 days.

(21) Appl. No.: 10/732,432

(22) Filed: Dec. 10, 2003

(65) Prior Publication Data
US 2004/0149379 A1 Aug. 5, 2004

Related U.S. Application Data

(62) Division of application No. 09/682,897, filed on Oct. 30, 2001, now abandoned.

(30) Foreign Application Priority Data
Oct. 30, 2000 (JP) ............................. 2000-331429

(51) Int. Cl.
*B29C 43/10* (2006.01)
*B29C 43/56* (2006.01)
*B29D 11/00* (2006.01)
*B32B 37/10* (2006.01)
*G02F 1/13* (2006.01)

(52) U.S. Cl. .................. 156/382; 156/285; 349/187; 425/389

(58) Field of Classification Search ................. 156/382, 156/285, 286, 104; 425/388, 389; 349/187–192, 349/153, 154; 264/510, 511, 546, 553, 570, 264/571; 100/211
See application file for complete search history.

(56) References Cited

U.S. PATENT DOCUMENTS

| | | | | | |
|---|---|---|---|---|---|
| 2,636,539 | A | * | 4/1953 | Pajak | 156/382 X |
| 3,264,157 | A | * | 8/1966 | Lattimer | 156/285 X |
| 4,596,624 | A | * | 6/1986 | Frohlich et al. | 156/382 |
| 4,626,303 | A | | 12/1986 | Ogura | 156/145 |
| 4,691,995 | A | | 9/1987 | Yamazaki et al. | 349/189 |
| 4,715,686 | A | | 12/1987 | Iwashita et al. | 349/187 X |
| 4,869,770 | A | * | 9/1989 | Christensen et al. | 156/382 X |
| 4,922,972 | A | | 5/1990 | Watanabe et al. | 349/189 X |
| 4,922,974 | A | | 5/1990 | Watanabe et al. | 156/99 X |
| 4,986,870 | A | * | 1/1991 | Frohlich | 156/382 |
| 5,094,709 | A | * | 3/1992 | Eichelberger et al. | 156/382 X |

(Continued)

FOREIGN PATENT DOCUMENTS

JP 47-17578 U 10/1972

(Continued)

OTHER PUBLICATIONS

English language translation of abtract of JP 59-57221.
English language translation of abstract of JP 11-95230.
English language translation of abstract of JP 47-17578 U.
English language translation of abstract of JP 11-194352.

*Primary Examiner*—Adrienne C Johnstone
(74) *Attorney, Agent, or Firm*—Thomas, Kayden, Horstemeyer & Risley

(57) ABSTRACT

Provided is an adjusting method of a gap width of a laminated body composed of a color filter substrate and a TFT array substrate. A decompression chamber acting as a closed space communicating with a vacuum pump is decompressed, while a pressurization chamber that includes a decompression chamber is pressurized by driving a compressor.

6 Claims, 16 Drawing Sheets

U.S. PATENT DOCUMENTS

| | | | |
|---|---|---|---|
| 5,141,036 A | | 8/1992 | Watanabe et al. .......... 156/99 X |
| 5,264,058 A | * | 11/1993 | Hoagland et al. ....... 156/285 X |
| 5,568,297 A | | 10/1996 | Tsubota et al. .............. 156/145 |
| 5,785,800 A | * | 7/1998 | Natarajan et al. ........... 156/382 |
| 6,004,423 A | | 12/1999 | Ruedin et al. ............... 156/292 |
| 6,036,568 A | | 3/2000 | Murouchi et al. ....... 349/190 X |
| 6,077,066 A | * | 6/2000 | Hanusiak et al. ........ 156/382 X |
| 6,095,203 A | | 8/2000 | Yamamoto et al. ...... 349/189 X |
| 6,128,066 A | | 10/2000 | Yokozeki .................... 349/187 |
| 6,181,408 B1 | | 1/2001 | von Gutfeld et al. ........ 349/189 |
| 6,531,329 B2 | | 3/2003 | Asakura et al. ......... 349/189 X |
| 6,552,772 B2 | | 4/2003 | Egami ........................ 349/187 |
| 6,573,972 B2 | | 6/2003 | Sasaki ........................ 349/190 |

FOREIGN PATENT DOCUMENTS

| | | | |
|---|---|---|---|
| JP | 59-57221 | | 4/1984 |
| JP | 7-5405 A | | 1/1995 |
| JP | 08011200 A | * | 1/1996 |
| JP | 11-95230 | | 4/1999 |
| JP | 11-194352 | | 7/1999 |

* cited by examiner

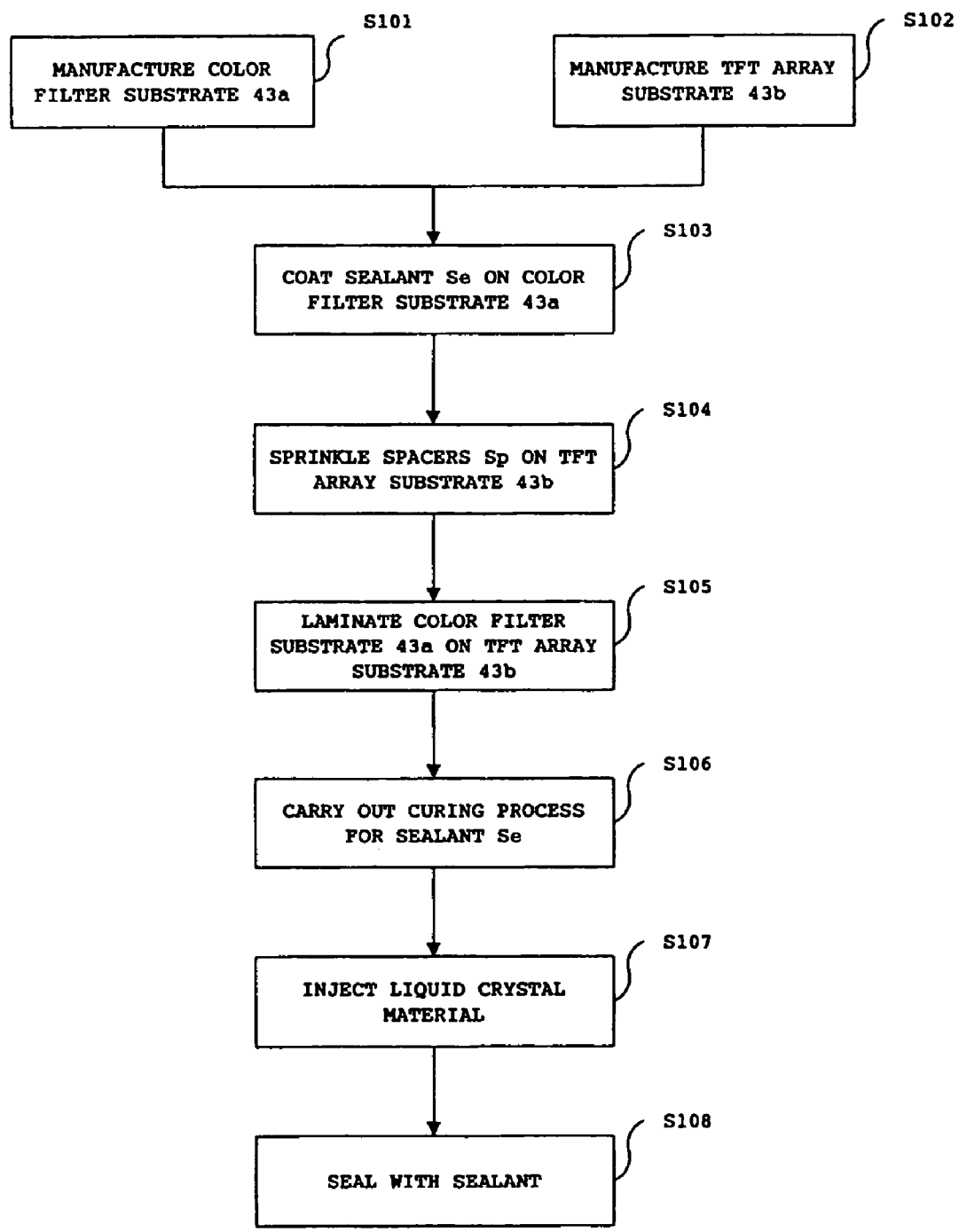

FIG. 4A
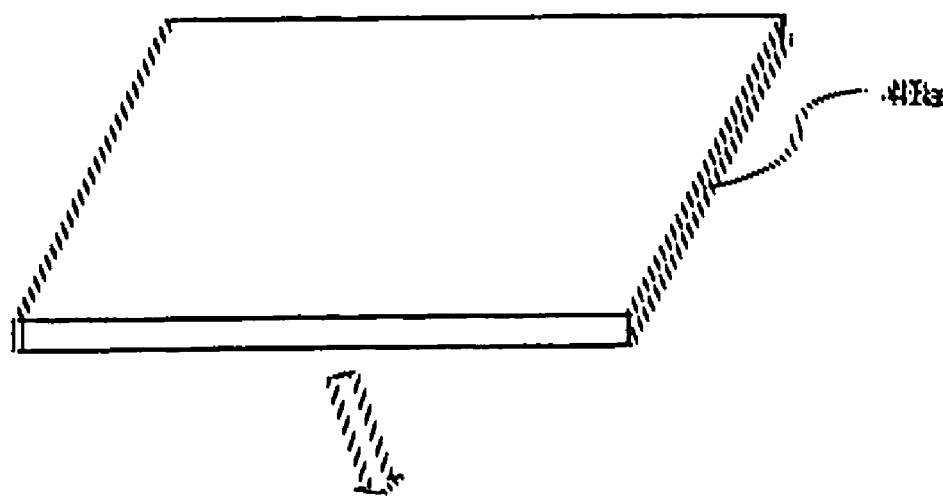
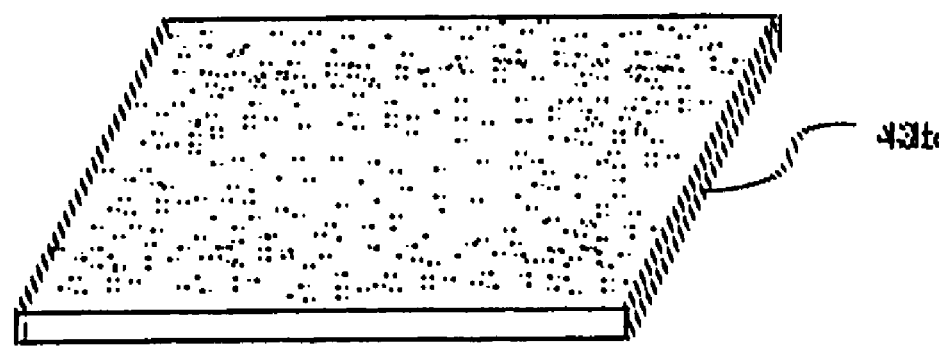

APPARATUS FOR ADJUSTING GAP WIDTH OF LAMINATED BODY

CROSS-REFERENCE TO RELATED APPLICATION

This application is a divisional application of U.S. application Ser. No. 09/682,897, filed Oct. 30, 2001, now abandoned, hereby incorporated by reference herein in its entirety.

BACKGROUND OF INVENTION

The present invention relates to a manufacturing method of a display device such as a liquid crystal display panel, more particularly to an adjusting technique of a gap width between two device substrates.

As an image display device for a personal computer or other various monitors, a liquid crystal display device has been remarkably widespread. Such a liquid crystal display device is generally constructed in such a manner that a backlight as a planar light source for illumination is disposed on a back of a liquid crystal display panel to irradiate a liquid crystal surface of a specified expanse so as to even the brightness thereon, and that an image formed on the liquid crystal surface can be thereby visualized.

The liquid crystal display device includes a liquid crystal display panel constructed by sealing a liquid crystal material between two glass substrates, and a printed circuit board for driving the liquid crystal material. The printed circuit board is mounted on the liquid crystal display panel. A backlight unit is disposed on the back of the liquid crystal display panel with a liquid crystal display panel holding frame being interposed therebetween. An outer frame surrounds the above-described components. The glass substrate comprises the liquid crystal display panel and the electrodes for driving the liquid crystal material on which are formed.

A manufacturing process of a thin film transistor (TFT) liquid crystal display device among such liquid crystal display devices includes the steps of having an array step, a cell step and a module step.

The array step includes installing TFTs, pixel electrodes, data lines, gate lines and the like on one of the two glass substrates. Since the TFTs are regularly arrayed on the glass substrate, the step is referred to as an array step.

The cell step includes adhering the array substrate obtained in the array step and a color filter substrate as a substrate opposite to the array substrate, and injecting a liquid crystal material in a gap as a space between the two substrates, then sealing the gap. The substrate obtained in this step is referred to as a panel substrate.

The module step includes mounting an electric circuit for electrically controlling the panel substrate obtained in the cell step, and further mounting parts such as a backlight and the like.

The contents of the cell step among the foregoing steps will be described below. Sealant is coated on the periphery of the color filter substrate. The sealant is provided for sealing the liquid crystal material between the array substrate and the color filter substrate. Note that the sealant is coated in the form of a picture frame except a portion serving as an injection port for injecting the liquid crystal material. An example of such a sealant may include a thermosetting resin or an ultraviolet-setting resin. Meanwhile, an orientation film is formed on the array substrate, and then spacers are sprinkled thereon. The spacers are sprinkled for regulating a gap width between the array substrate and the color filter substrate. Examples of such spacers may include spherical silica, spherical polyethylene or the like. Note that, instead of sprinkling the spherical spacers, a technique of installing columnar spacers on the array substrate or the color filter substrate has been examined recently. After sprinkling the spacers, the color filter substrate is laminated onto the array substrate, and the sealant is cured. After curing the sealant, the liquid crystal material is injected-into the gap between the array substrate and the color filter substrate. For the injection, an injection apparatus using an vacuum injection method is used in many cases. Specifically, the laminated substrates are disposed in a vacuum chamber, and the gap between the two substrates is evacuated. The foregoing injection port is immersed in the liquid crystal material while maintaining the evacuated state, then, by returning the chamber pressure from the vacuum to the atmospheric pressure, the liquid crystal material is filled in the gap. Thereafter, the injection port is sealed by the thermosetting resin or the ultraviolet-setting resin. Thus summarizing the cell step.

The gap between the array substrate and the color filter substrate, that is, the cell gap, is extremely narrow. Typically the gap is 5 micrometers or less, desirably 3 to 5 micrometers. Image quality of the liquid crystal display device is greatly affected by the gap. Hence, the cell gap must be strictly controlled.

In order to control the cell gap, an even pressure must be applied to the substrates when the color filter substrate is laminated onto the array substrate. For this purpose, there have been various proposals including the ones disclosed in the gazettes of Japanese Patent Laid-Open No. Sho 57 (1982)-188018, Japanese Patent Publication No. Hei 6 (1994)-16137 and Japanese Patent No. 2976925.

In the gazettes of Japanese Patent Laid-Open No. Sho 57 (1982)-188018 and Japanese Patent Publication No. Hei 6 (1994)-16137, two methods have been proposed. In both of the methods, as shown in FIGS. 13 and 14, a laminated body composed of an array substrate 101 and a color substrate 102 whose gap has not been filled with the liquid crystal material yet is disposed in a sealed container 100 formed of an elastic material, for example, silicon rubber. Thereafter, as shown in FIG. 13, the sealed container 100 is decompressed, and alternatively, as shown in FIG. 14, an air pressure is applied from the outside of the sealed container 100. Since each of these methods is a method of applying a pressure to the substrates by allowing a fluid pressure to act on the elastic material, the pressure applied to the substrates is sufficiently even. Moreover, in the gazette of Japanese Patent No. 2976925, a laminated body composed of an array substrate and a color filter substrate is disposed in a sealed container formed of an elastic material. Then, the container is decompressed, and thereafter, such decompression is released to inject a liquid crystal material into a cell gap by making use of a difference between pressures of the inside and outside of the container, which is generated when the container is released to the atmospheric pressure.

However, among the techniques disclosed in the gazettes of Japanese Patent Laid-Open No. Sho 57 (1982)-188018, Japanese Patent Publication No. Hei 6 (1994)-16137 and Japanese Patent No. 2976925, in the method of decompressing the sealed container, the difference between the air pressures of the inside of the sealed container and the outside thereof (atmosphere) cannot be set at 1 atm. or higher. Hence, only a pressurization force up to 1 kgf/square cm can be applied to the array substrate and the color filter substrate. Here, the sealant is coated to have a thickness thicker than the cell gap, and the sprinkled spacers are overlapped from one to another. Thus, the cell gap with a desired width is hard to obtain. Although described later in detail, with such a pressurization force of about 1 kgf/square cm, the cell gap of a desired width was not able to be obtained. Accordingly, by the conventional method of decompressing the sealed container, it is difficult to adjust the cell gap to a desired micro value. Meanwhile, in accordance with the method of pressurizing the sealed container from the outside, it is possible to apply a pressure higher than that by the method of decompressing the sealed container. However, when the sealed container is released to the atmospheric pressure after the container is pressurized from the outside, a force acts in the direction where the array substrate and the color filter substrate are torn off from each other. Specifically, when a high air pressure is applied to the sealed container from the outside, the air in the sealed container is compressed so as to oppose such a pressurization force, resulting in a pressure increase in the cell gap. When the sealed container is released to the atmospheric pressure from the pressure-increased state, the pressure in the cell gap exceeds the air pressure of the outside, that is, 1 atm. in the atmosphere. Thus, the force acts in the direction where the array substrate and the color filter substrate are torn off from each other as described above, affecting adversely the control of the cell gap. Moreover, the force involves the possibility of exfoliating the sealant and one of the array substrate and the color filter substrate from each other. Such exfoliation in an uncured state of the sealant is not desirable since the exfoliation causes bubble mixing to the sealant and leads to the lowering of joining forces of the cured sealant.

SUMMARY OF INVENTION

The present invention was made with the foregoing circumstances in mind. An object of the present invention is to provide an adjusting method of a gap width and an adjusting apparatus thereof, which are effective when two sheets are laminated with a specified gap width. Another object of the present invention is to provide a manufacturing method of a display panel applying the adjusting method of the gap width and the adjusting apparatus thereof.

Specifically, according to a first aspect of the present invention, provided is a method of adjusting a gap width of a laminated body composed of first and second substrates, having the steps of obtaining the laminated body by laminating the first and second substrates with a member for regulating the gap width interposed therebetween, and decompressing the gap and applying a pressure to the laminated body from the outside.

Moreover, according to a second aspect of the present invention, provided is an apparatus of adjusting a gap width of a laminated body composed of first and second substrates and having a planar portion. The apparatus includes a first chamber having a closed space for accommodating the laminated body and provided with a flexible film contacting the planar portion of the laminated body, a second chamber having a closed space for accommodating the first chamber, a decompressor for applying a decompression force to the first chamber, and a pressurizer for applying a pressurization force to the second chamber.

The present invention can be applied to the following method of manufacturing a display panel, in which the above-described method of adjusting a gap width is applied to a method of manufacturing a display device such as a liquid crystal display device. Specifically, according to a third aspect of the present invention, provided is a manufacturing method of a display panel in which a display medium is sealed between a pair of substrates disposed opposite to each other, the substrates being separated from each other with a gap of a specified width, the method comprising the steps of: (a) coating sealant in the form of a picture frame on a peripheral portion of at least one of the pair of substrates except an injection port for the display medium; (b) obtaining a laminated body having the gap of the specified width by laminating the pair of substrates with the sealant interposed therebetween; (c) applying a pressure to the pair of substrates from the outside while decompressing the gap; (d) curing the sealant; and (e) injecting the display medium from the injection port after curing the sealant.

In the above, description has been made focusing on the application of the present invention to the adjustment of a gap. However, the present invention can be also recognized as a method and an apparatus of applying a pressure to an article. Specifically, according to a fourth aspect of the present invention, provided is a method of applying a pressure to an article with a hollow portion communicating with the outside. The method includes the steps of applying a pressurization force to an article by a fluid in a state where the article is disposed in a closed space, allowing simultaneously a hollow portion to communicate with a system different from that of the closed space, and applying a decompression force to the hollow portion through the different system.

Moreover, according to a fifth aspect of the present invention, provided is an apparatus for realizing the method of applying a pressure to an article. Specifically, the pressure applying apparatus of this aspect is an apparatus of applying a pressure to an article having a first chamber having a closed space for accommodating the article and provided with a diaphragm in a part thereof, a second chamber provided with a closed space including the first chamber, a decompressor for applying a decompression force to the first chamber; and a pressurizer for applying a fluid pressure to the second chamber. The apparatus of applying a pressure to an article is characterized in that the diaphragm applies a pressure to the article when the decompressor applies the decompression force to the first chamber, and applies the pressure to the article when the pressurizer applies the fluid pressure to the second chamber.

Various other objects, features, and attendant advantages of the present invention will become more fully appreciated as the same becomes better understood when considered in conjunction with the accompanying drawings, in which like reference characters designate the same or similar parts throughout the several views.

BRIEF DESCRIPTION OF DRAWINGS

For a more complete understanding of the present invention and the advantages thereof, reference is now made to the following description taken in conjunction with the accompanying drawings.

FIG. 2 is a flowchart schematically showing a manufacturing process of a liquid crystal display panel according to an embodiment of the present invention.

FIGS. 4A and 4B are views illustrating the manufacturing process of the liquid crystal display panel according to an embodiment of the present invention.

DETAILED DESCRIPTION

Figure 1:
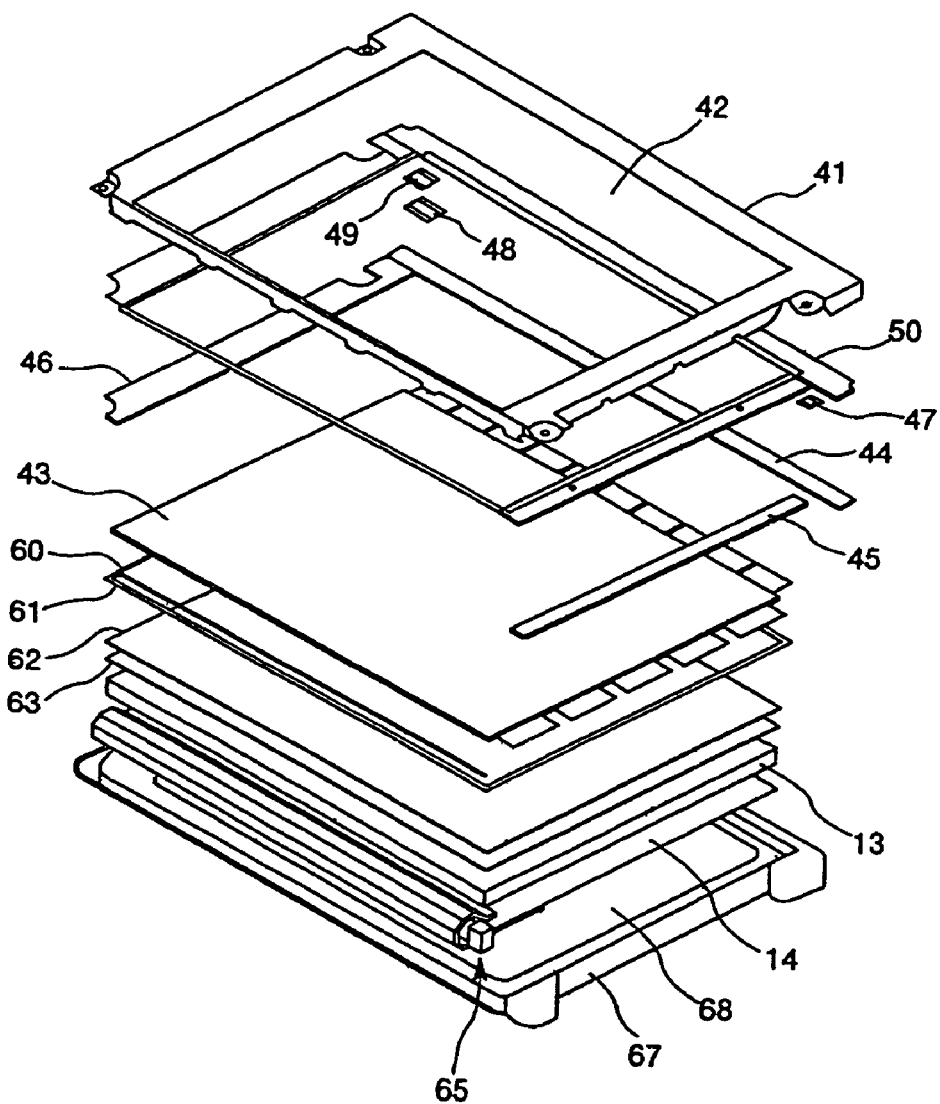
FIG. 1 is an exploded perspective view of a liquid crystal display device.

As described above, in the conventional methods, a large pressure can be applied to the substrates from the outside. However in this case, there occurs a phenomenon that the air compressed in the gap tears off the array substrate and the color filter substrate after releasing the pressure applied thereto. This phenomenon occurs because the laminated body composed of the array substrate and the color filter substrate is disposed in the sealed container. However, the inventor of the present invention has paid attention to the following. Specifically, the sealed container is evacuated to be decompressed while a pressure is applied to the substrates from the outside. Thus, a phenomenon that the pressure between the array substrate and the color filter substrate disposed in the sealed container, that is, the pressure in the cell gap, gets higher than the atmospheric pressure can be prevented.

In accordance with the method of adjusting a gap width of the first aspect, the gap is decompressed, and a pressure is applied to the laminated body from the outside. Hence, the pressure in the gap can be maintained at the atmospheric pressure or lower. Therefore, after releasing the decompression of the gap and the pressurization from the outside, the occurrence of a force acting to tear off the first and second substrates from each other can be prevented.

Moreover, according to the method of adjusting a gap width of the first aspect, not only the gap is decompressed, but also a pressure is applied to the laminated body from the outside. Therefore, a pressurization force sufficient for obtaining a micro gap width can be obtained.

In this aspect, how much the gap is decompressed or how much pressure is applied to the laminated body from the outside may be properly determined depending on specifications such as a size of the laminated body and a gap width thereof.

In this aspect of the method of adjusting a gap width, a method of applying a pressure to the laminated body from the outside includes: a method of mounting a weight on the laminated body; and a method of applying a pressure thereto with a fluid taken as a pressure medium. However, the method with a fluid taken as a pressure medium is advantageous in that a pressure to the laminated body can be made even and that a step of applying a pressure to the laminated body is readily incorporated into the manufacturing process of the laminated body. Hence, in the method of adjusting a gap width of this aspect, the pressure applied to the laminated body from the outside is desirably applied with a fluid taken as a pressure medium.

Moreover, in the method of adjusting a gap width of this aspect, a specific method of decompressing the gap includes: disposing the laminated body in a first closed space and allowing a suction force to act in the first closed space. In this case, a specific method for applying a pressure to the laminated body from the outside is as follows. Specifically, a second closed space covering the first closed space is formed, and a pressure can be applied to the laminated body from the outside by introducing a pressurized fluid into the second closed space.

The apparatus of adjusting a gap width of this aspect includes a first chamber provided with a flexible film contacting the planar portion of the laminated body, and a decompressor for applying a decompression force to the first chamber. Hence, when the decompression force is applied to the first chamber by the decompressor, the gap in the laminated body can be decompressed. In addition, a pressure can be applied to the laminated body through the flexible film, which is influenced by the decompression force.

Moreover, in the apparatus of adjusting a gap width of this aspect, the first chamber is accommodated in a second chamber. Hence, a pressure can be applied to the laminated body accommodated in the first chamber through the flexible film of the first chamber by supplying a compressed fluid from the pressurizer to the second chamber.

Here, in the apparatus of adjusting a gap width of this aspect, decompression of the gap of the laminated body and pressurization of the laminated body from the outside can be simultaneously performed by simultaneously decompressing the first chamber by the decompressor and pressurizing the second chamber by the pressurizer.

In the apparatus of adjusting a gap width of this aspect, the first chamber can be formed only of a flexible film, for example, a bag-like container made of rubber. However, it is desirable that the first chamber includes a mounting stage for mounting the laminated body, and the flexible film forming the closed space with the mounting stage by closely contacting a periphery thereof to the mounting stage, and that the laminated body be accommodated in the closed space. In the chamber formed as above, in which the flexible film is set so as to automatically ascend and descend relative to the mounting stage, it is sufficient that the laminated body is only mounted on the mounting stage. Therefore, as compared with the case of using the rubber-made container in which the laminated body is inserted, operability is improved.

Moreover, in the apparatus of adjusting a gap width of this aspect, it is desirable that the pressurizer apply a pressurization force to the second chamber by introducing a pressurized fluid thereto, and the pressurization force be allowed to act on the laminated body through the flexible film. This is because the pressurization force can be evenly applied to the laminated body.

Since the method of manufacturing a display panel of this aspect includes the step of applying a pressure to the pair of substrates from the outside while decompressing the gap, the gap of the display panel can be adjusted to a desired micro value.

In accordance with steps of the present invention, the pressure applied from the outside can be applied with a fluid taken as a pressure medium. This is for controlling the gap width evenly by applying an even pressure to the display panel to secure image quality.

In the method of manufacturing a display panel of this aspect, the curing process for the sealant can be performed while continuing the decompression of the gap and the pressurization from the outside. However in this case, the decompression of the gap and the pressurization from the outside cannot be carried out during the curing process in the concerned apparatus, which is not desirable in terms of production efficiency. Hence, it is desirable to perform the curing process of the sealant after releasing the decompression of the gap and the pressurization from the outside. Particularly, in the method of manufacturing a display panel of this aspect, a pressure is applied to the pair of substrates from the outside while the gap is decompressed. Accordingly, a force in a direction where the pair of substrates are torn off does not act after releasing the decompression of the gap and the pressurization from the outside. Therefore, the curing process for the sealant can be performed after releasing the decompression of the gap and the pressurization from the outside. Here, in order not to allow the force to act in the direction where the pair of substrates are torn off after releasing the decompression of the gap and the pressurization from the outside, the pressure in the gap must be set equal to the atmospheric pressure or lower by adjusting the decompression force to the gap and the pressurization force applied from the outside. Hereinbelow, description will be made for an embodiment of the present invention with reference to the drawings.

FIG. 1 is an exploded perspective view showing a color thin film transistor (TFT) liquid crystal display device as one of application objects of the present invention.

In FIG. 1, a metal-made shield 41 case forms an upper frame, which forms a display window 42 for defining an effective screen of a liquid crystal display module. A liquid crystal display panel 43, in which TFTs having source/drain electrodes, gate electrodes and amorphous silicon layers and the like deposited thereon, color filters and the like are laminated between a pair of glass substrates, and a liquid crystal material is sealed therebetween.

On the liquid crystal display panel 43, a drain circuit substrate 44, a gate circuit substrate 45 and an interface circuit substrate 46 are formed. Furthermore, joiners 47, 48 and 49 are provided for connecting the circuit substrates. These circuit substrates 44, 45 and 46 are fixed to the shield case 41 with an insulating sheet 50 interposed therebetween.

Meanwhile, under the liquid crystal display panel 43, a light shielding spacer 61 is provided with a rubber cushion 60 interposed therebetween, and further, a diffusion plate 62 and a prism sheet 63 are provided thereunder. The diffusion plate 62 has a function of diffusing light from a light guide plate 13 to be described later in order to obtain even planar light. The prism sheet 63 is used to increase luminance in the front direction. Furthermore, under the prism sheet 63, the light guide plate 13 is provided, and a fluorescent lamp unit 65 is provided on one side of the light guide plate 13. Two fluorescent lamp units 65 may be provided on two sides thereof. Still further, under the light guide plate 13, a reflection plate 14 is provided. The reflection plate 14 is constructed in such a manner that light made incident onto the light guide plate 13 from the fluorescent lamp unit 65 can be reflected toward the direction of the liquid crystal display panel 43. Under the reflection plate 14, a lower case 67 with an aperture 68 is provided.

In the pair of glass substrates comprising the liquid crystal display panel 43, one constitutes the color filter substrate, and the other constitutes the TFT array substrate. As such glass substrates, non-alkali glass excellent in flatness with a thickness of, for example, 0.7 mm is used.

The color filter substrate is made by sequentially laminating: on the glass substrate, color filters composed of resin films containing dyes or pigments of three primary colors, that is, red (R), green (G) and blue (B); a black matrix as a light shielding film disposed among pixels of the color filters; a protection film composed of a resin film for protecting the color filters and the black matrix; a common electrode composed of a transparent conductive thin film of indium tin oxide (ITO); and an orientation film composed of a polyimide thin film for orienting the liquid crystal material.

The TFT array substrate is made by forming: on the glass substrate, display electrodes as pixels for display composed of ITO; TFTs as switching elements for driving the liquid crystal; and storage capacitors as signal retaining capacitors for operating the active matrix.

The color filter substrate and the TFT array substrate are adhered by the sealant as an adhesive in the peripheries thereof. An area surrounded by the sealant serves as an image display area.

In the image display area, the spacers are disposed for regulating the gap between the color filter substrate and the TFT array substrate, that is, the thickness (cell gap) of the liquid crystal layer. For the spacers, silica ($SiO_2$) or resin particles are used. Since the cell gap of the color TFT liquid crystal display device is about 5 micrometers or less, desirably 3 to 5 micrometers, the spacers also with a diameter of about 5 micrometers or less, desirably 3 to 5 micrometers are used. Recently, columns capable of serving as spacers are also formed on the color filter substrate or the TFT array substrate by a thin film forming process.

A description will now be made for a manufacturing process of the above-described liquid crystal display panel 43 with reference to FIGS. 2 to 4.

As shown in FIGS. 2 to 4, a color filter substrate 43a and a TFT array substrate 43b are manufactured, respectively (S101 and S102 in FIG. 2).

Figure 3A:
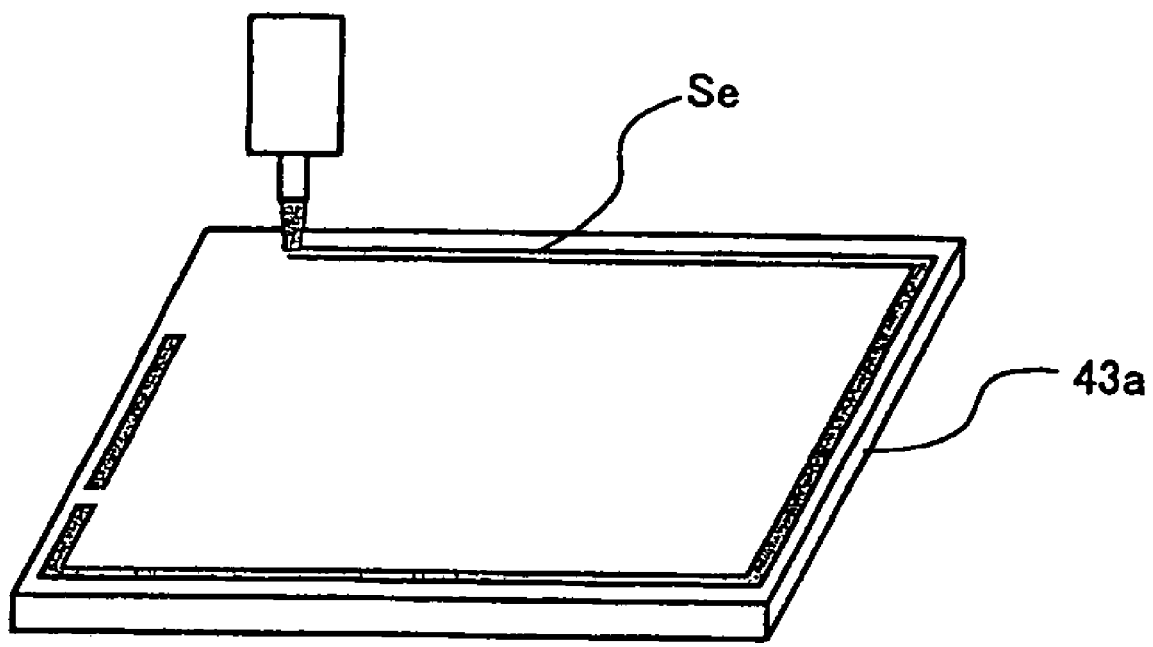
FIGS. 3A and 3B are views illustrating the manufacturing process of the liquid crystal display panel according to an embodiment of the present invention.

Next, on the periphery of the color filter substrate 43a, sealant Se is coated in the form of a picture frame (S103 in FIG. 2 and FIG. 3A). As the sealant Se, an ultraviolet-setting resin or a thermosetting resin can be used as described above. In this embodiment, however, a thermosetting resin is used. The sealant Se is coated on the periphery except an injection port for the liquid crystal material.

Figure 3B:
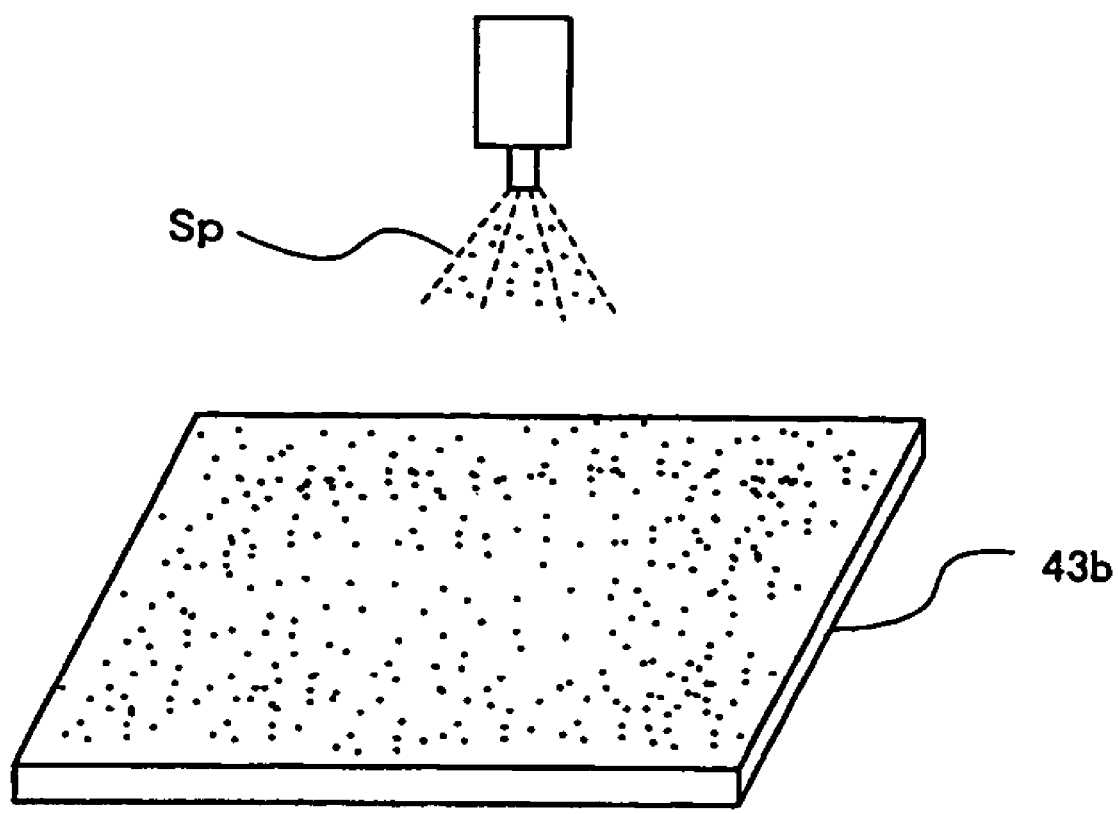

Meanwhile, on the TFT array substrate 43b, spacers Sp are sprinkled by a dispenser (S104 in FIG. 2 and FIG. 3B).

Figure 4B:
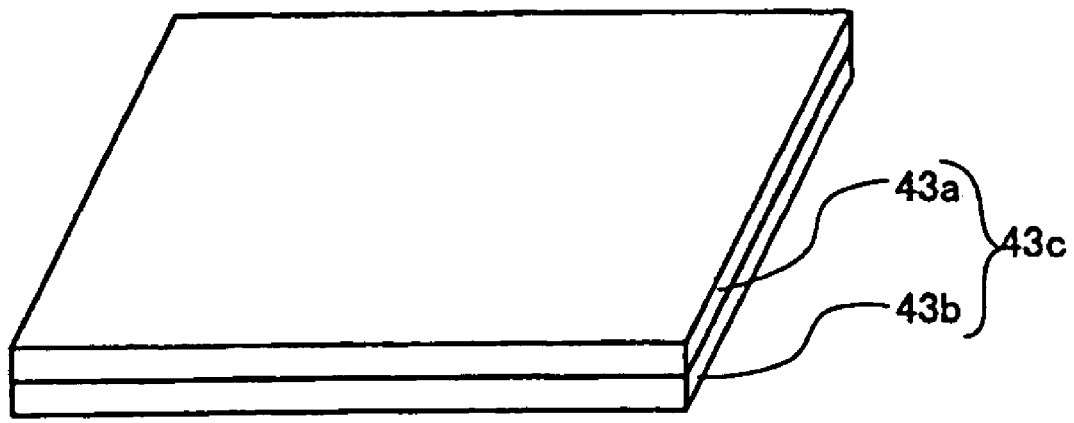

After sprinkling the spacers Sp on the TFT array substrate 43b, the color filter substrate 43a is laminated on the TFT array substrate 43b to obtain a laminated body 43c (S105 in FIG. 2, FIGS. 4A and 4B).

Features pertaining to the adjusting method of the cell gap of the laminated body 43c, and the contents thereof will be described later in detail.

Figure 12:
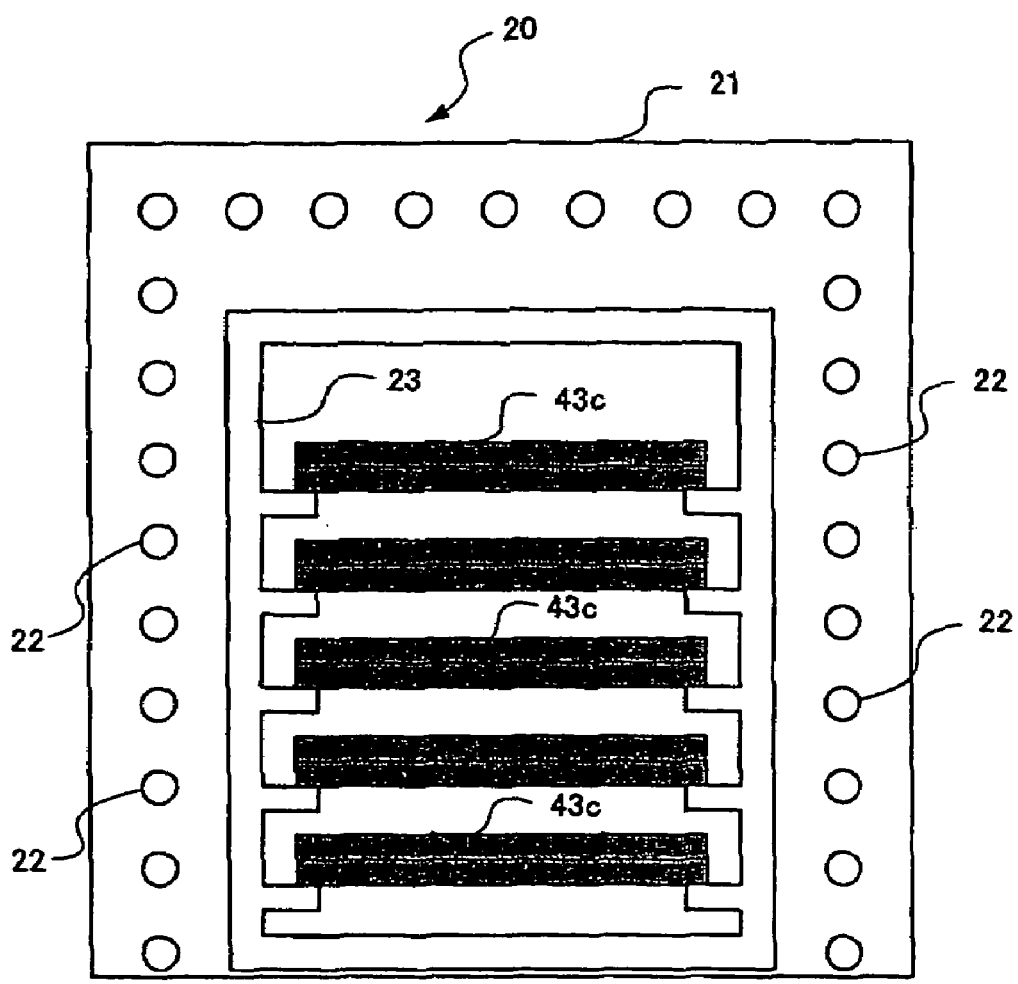
FIG. 12 is a view showing a heating furnace for curing sealant of the liquid crystal display panel according to an embodiment of the present invention.
Figure 13:
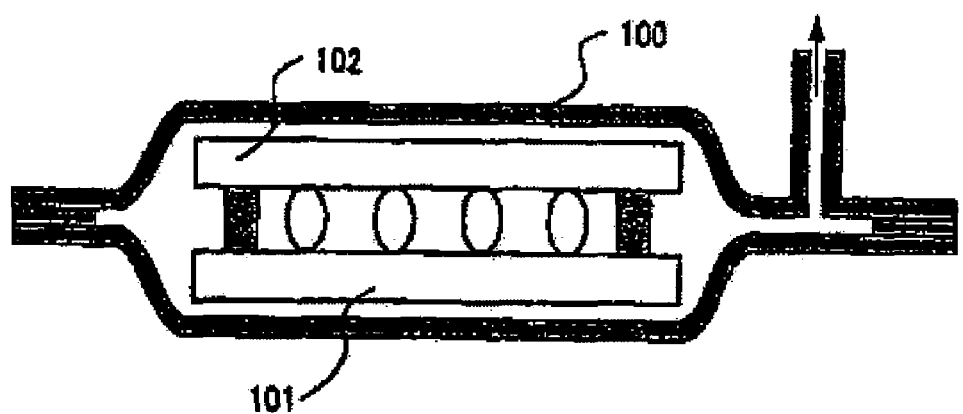
FIG. 13 is a view showing one example of a conventional gap-adjusting method of a liquid crystal display panel.
Figure 14:
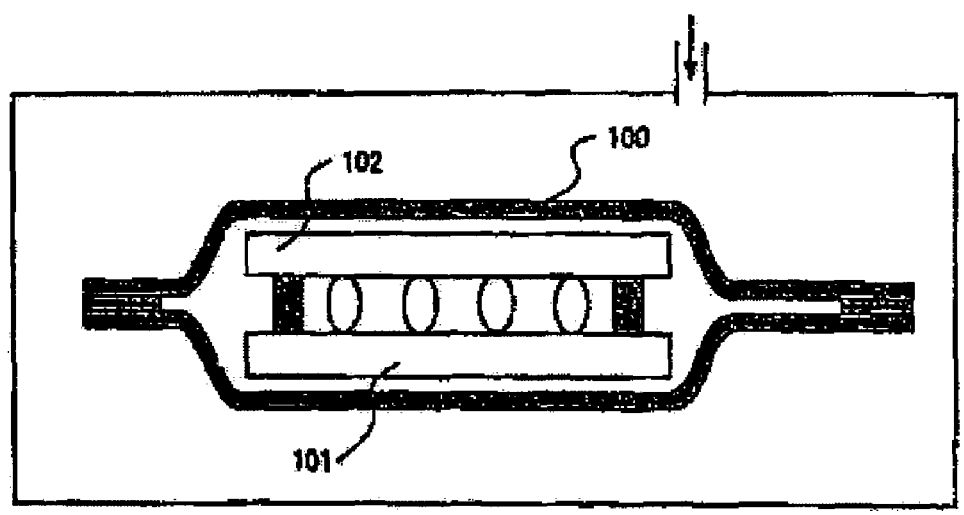
FIG. 14 is a view showing another example of the conventional gap-adjusting method of the liquid crystal display panel.

After adjusting the cell gap, a curing process for the sealant Se is carried out (S106 in FIG. 2). Since a thermosetting resin is used as the sealant Se in this embodiment, the laminated body 43c of the color filter substrate 43a and the TFT array substrate 43b is heated up to a specified temperature (S107 in FIG. 2). FIG. 12 illustrates an example of a heating furnace 20. The heating furnace 20 is constituted of: a furnace body 21 having heaters 22 buried therein and a heating space provided therein; and a rack 23 disposed in the heating space of the furnace body 21. The rack 23 can hold a plurality of the laminated bodies 43c. The laminated bodies 43c having been subjected to the cell-gap adjustment are sequentially placed in the rack 23, and when the specified number of laminated bodies 43c are placed therein, heating is started.

After the end of the curing process for the sealant Se, the liquid crystal material is injected. The injection of the liquid crystal material is carried out by the vacuum injection method described above. Specifically, the laminated substrates are disposed in a vacuum chamber, and the gap between the two substrates is evacuated. Then, the foregoing injection port is immersed in the liquid crystal material while maintaining the evacuated state, and thereafter, by returning the chamber pressure from the vacuum to the atmospheric pressure, the liquid crystal material is filled in the gap. Thereafter, the injection port is sealed by the thermosetting resin or the ultraviolet-setting resin (S108 in FIG. 2).

A series of the steps for manufacturing the liquid crystal display panel 43 has been described as above. Hereinbelow, description will be made for the adjusting method of a cell gap, which characterizes this embodiment.

Figure 5:
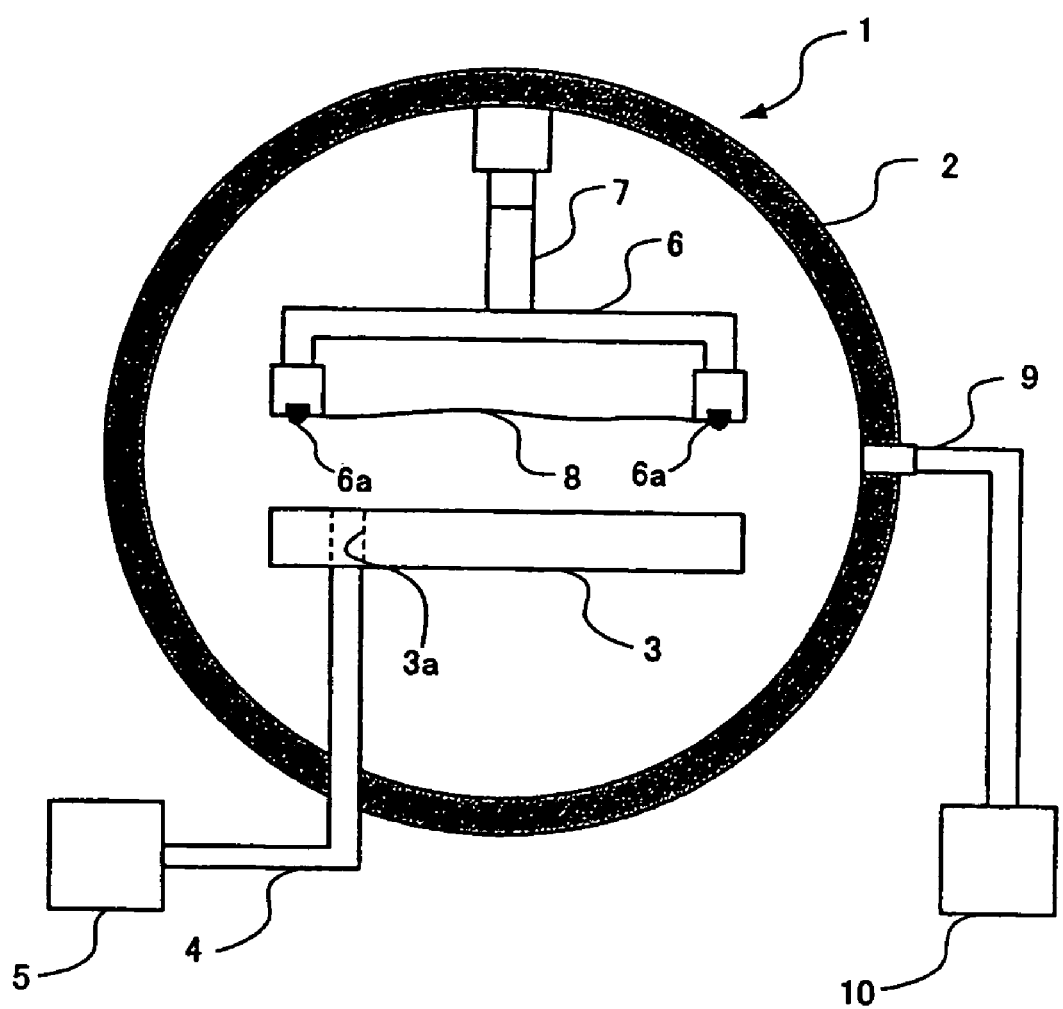
FIG. 5 is a side view showing a gap-width adjusting apparatus of the liquid crystal display panel according to an embodiment of the present invention.

FIG. 5 is a view showing the construction of a cell-gap adjusting apparatus 1 for controlling the cell gap in this embodiment. The cell-gap adjusting apparatus 1 comprises: a pressurization chamber 2; a mounting stage 3 for mounting the laminated body 43c of the color filter substrate 43a and the TFT array substrate 43b; and a frame 6 capable of ascending and descending relative to the mounting stage 3.

To the pressurization chamber 2, a compressor 10 is connected through a pressurization pipe 9 penetrating the pressurization chamber 2. The pressurization chamber 2 is pressurized by driving the compressor 10.

A penetration hole 3a penetrating the mounting stage 3 from an upper surface thereof to a lower surface thereof is formed in the mounting stage 3. To the penetration hole 3a, a decompression pipe 4 is connected. The decompression pipe 4 penetrates the pressurization chamber 2, and is connected to a vacuum pump 5 present in a system different from that of a closed space formed of the pressurization chamber 2.

The frame 6 is attached to a lower end of a freely extendable cylinder 7, and ascends and descends relative to the mounting stage 3 accompanied with the extension and the contraction of the cylinder 7. On lower end surfaces of sidewalls of the box-shaped frame 6, packings 6a are provided. Moreover, to the lower end surface of the frame 6, a sealing sheet 8 as a flexible film is adhered. The sealing sheet 8 can be made of a highly elastic and highly strong fiber, for example, Kevlar made by DuPont. When the frame 6 descends to the mounting stage 3, the packings 6a tightly contact the mounting stage 3. Hence, the periphery of the sealing sheet 8 closely contacts the mounting stage 3 with the packings 6a interposed therebetween. Accordingly, a chamber as a closed space can be formed. The chamber is connected to the vacuum pump 5, and forms the closed space together with the vacuum pump 5. In some cases, the chamber is called a decompression or first chamber 11, and the pressurization chamber 2 is called a second chamber.

Hereinbelow, description will be made for the adjusting method of the cell gap of the laminated body 43c composed of the color filter substrate 43a and the TFT array substrate 43b by the use of the cell-gap adjusting apparatus 1 shown in FIG. 5 with reference to FIGS. 6 to 11.

Figure 6:
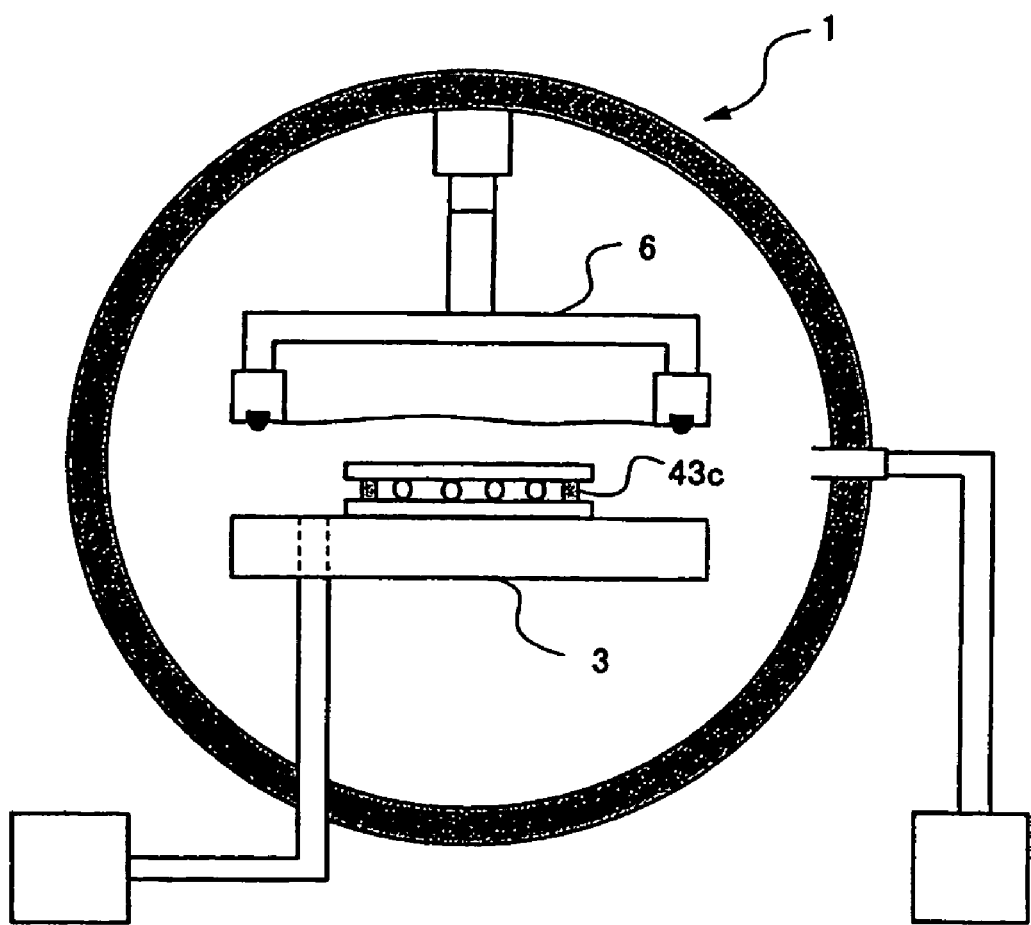
FIG. 6 is an explanatory view showing a gap-adjusting step of the liquid crystal display panel according to an embodiment of the present invention.
Figure 11:
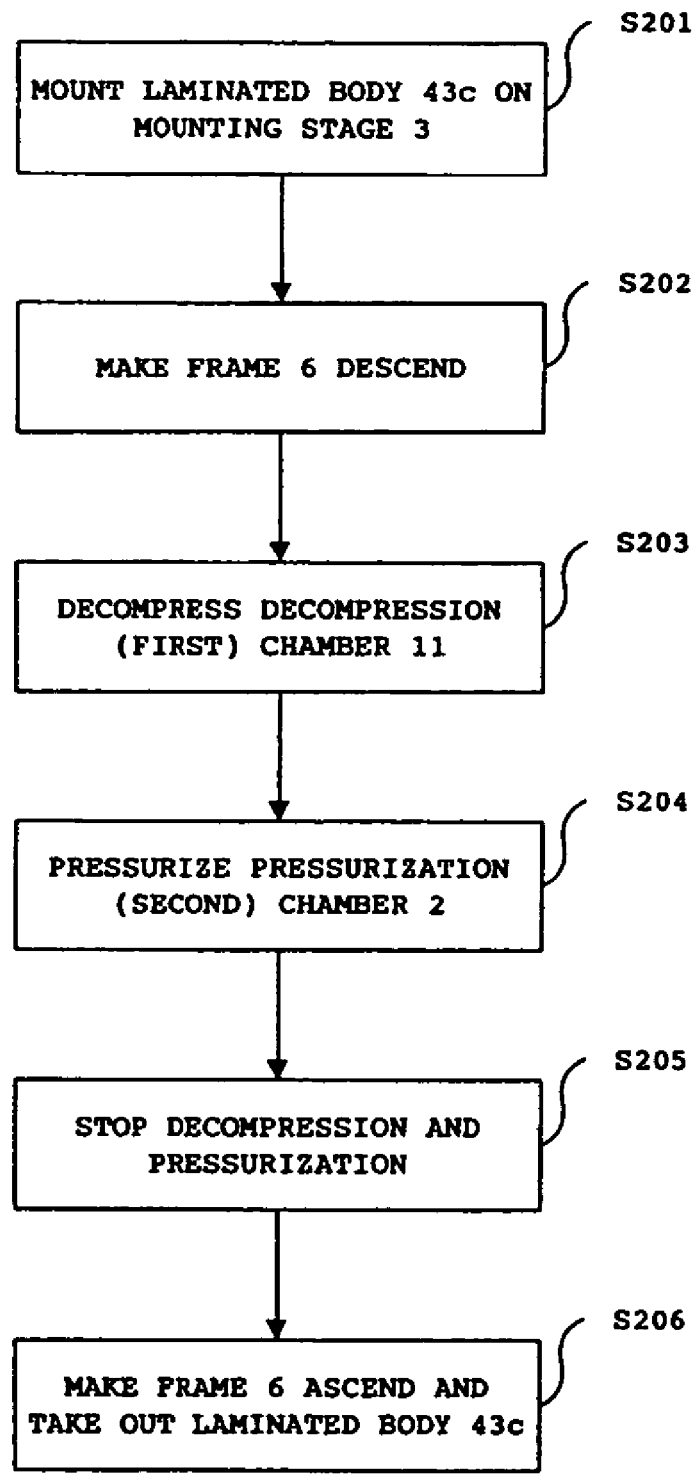
FIG. 11 is a flowchart showing the gap-adjusting process of the liquid crystal display panel according to an embodiment of the present invention.

First, the laminated body 43c is mounted on the mounting stage 3 of the cell-gap adjusting apparatus 1 in a state where the frame 6 ascends (S201 in FIG. 11 and FIG. 6).

Figure 7:
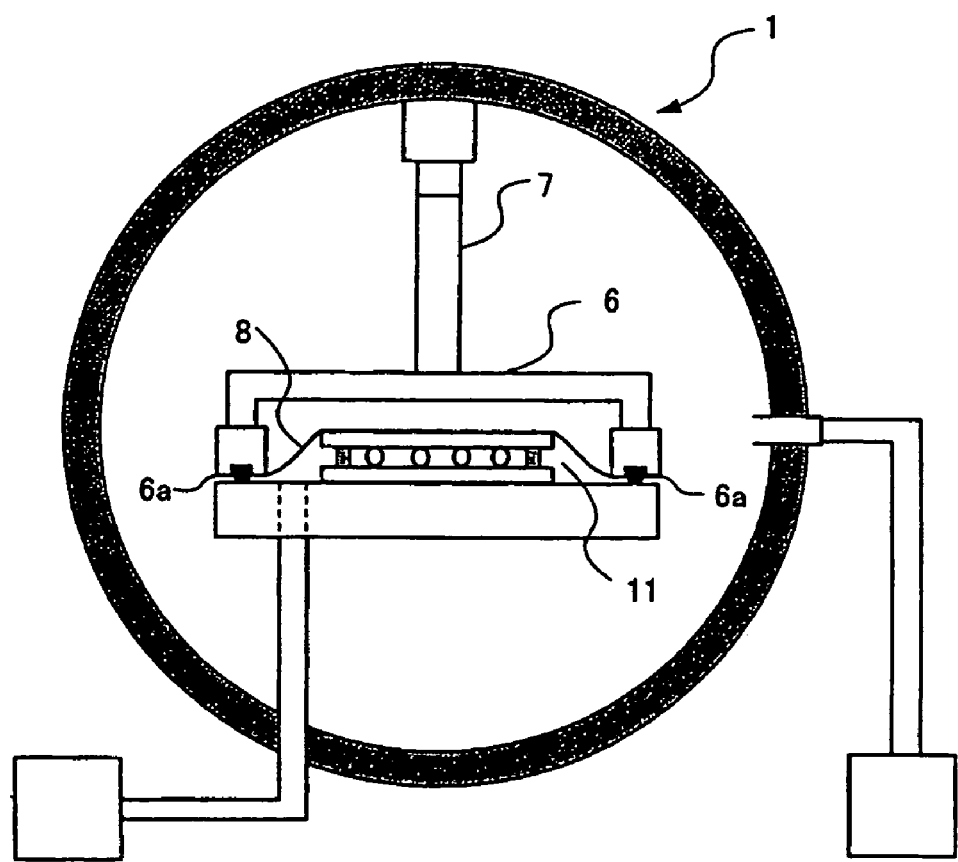
FIG. 7 is an explanatory view showing a gap-adjusting process of the liquid crystal display panel according to an embodiment of the present invention.

After mounting the laminated body 43c, by driving the cylinder 7, the frame 6 is made to descend until the packings 6a tightly contact the mounting stage 3 (S202 in FIG. 11 and FIG. 7). In the process, the sealing sheet 8 is stretched while contacting the plane of the laminated body 43c. In this state, an area surrounded by the mounting stage 3, the packings 6a and the sealing sheet 8 constitutes the decompression chamber 11 sealed from the outside. Hence, the laminated body 43c composed of the color filter 43a and the TFT array substrate 43b is placed in the decompression chamber (first chamber) 11 disposed in the pressurization chamber (second chamber) 2.

Figure 8:
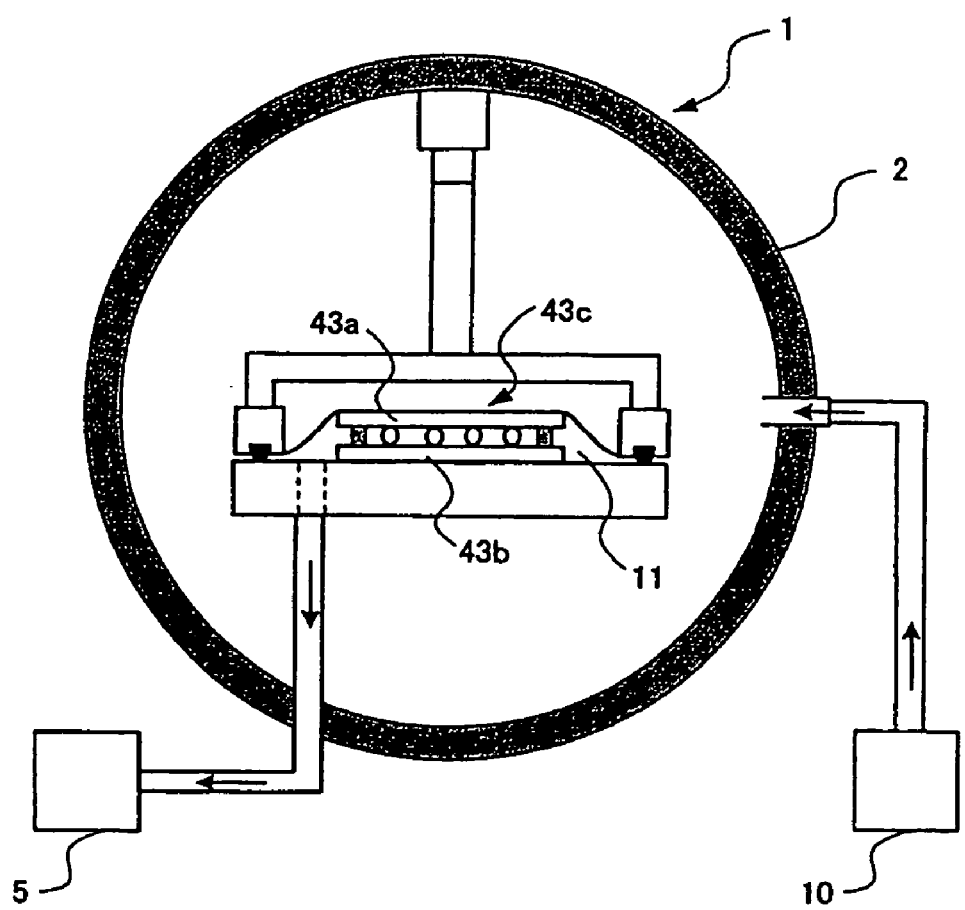
FIG. 8 is an explanatory view showing the gap-adjusting process of the liquid crystal display panel according to an embodiment of the present invention.
Figure 9:
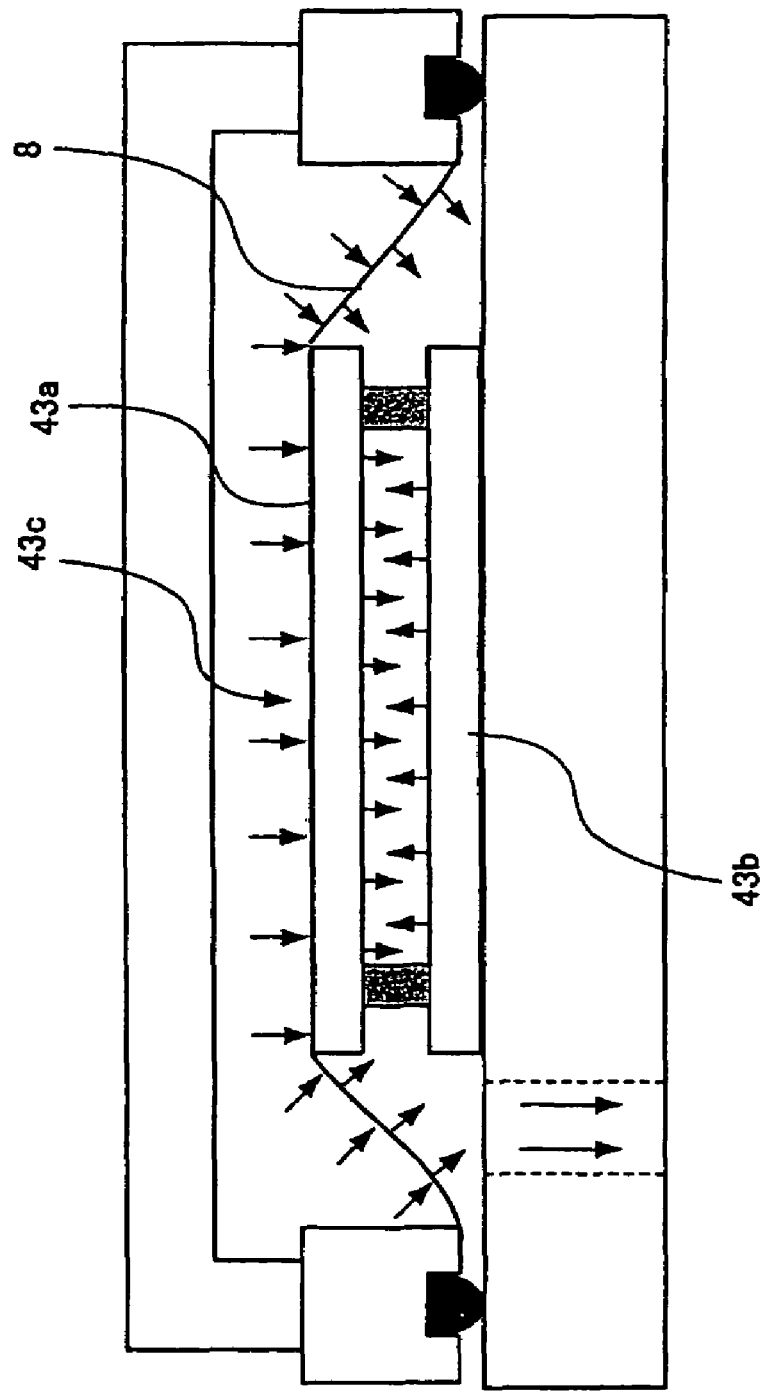
FIG. 9 is an explanatory view showing the gap-adjusting process of the liquid crystal display panel according to an embodiment of the present invention.
Figure 10:
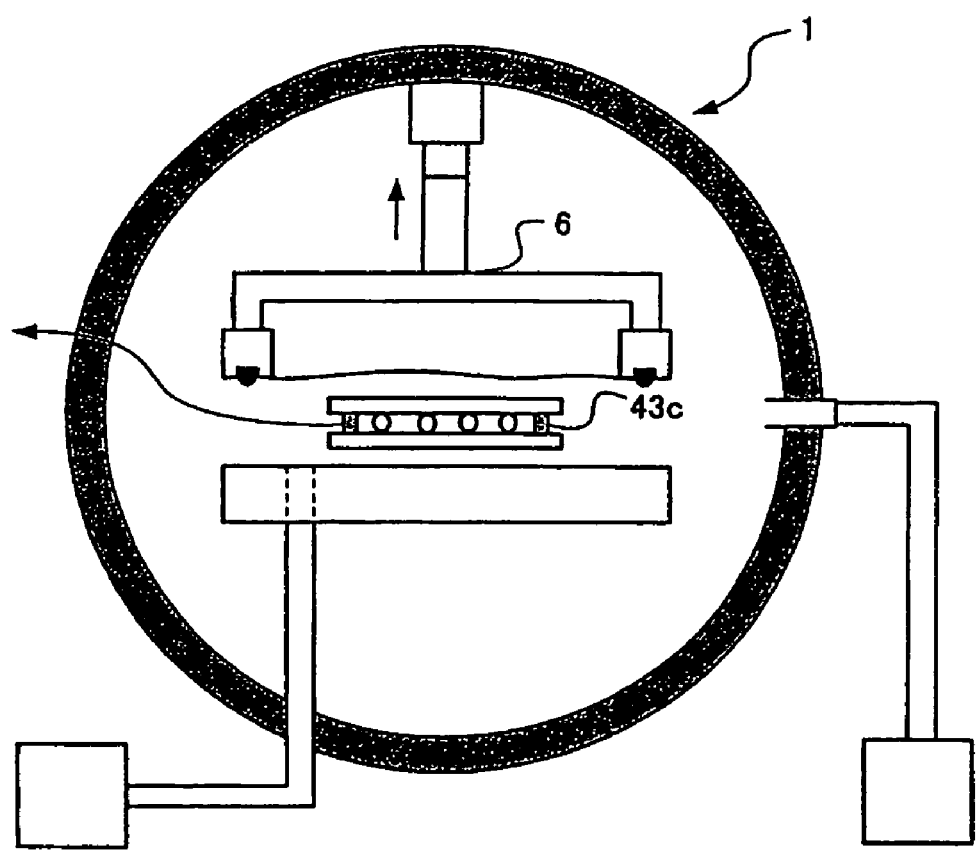
FIG. 10 is an explanatory view showing the gap-adjusting process of the liquid crystal display panel according to an embodiment of the present invention.

Next, by driving the vacuum pump 5, the decompression chamber 11 is evacuated so as to be set in a decompressed state (S203 in FIG. 11 and FIG. 8). Here, the cell gap of the laminated body 43c is decompressed through the injection port. Therefore, to the color filter substrate 43a and the TFT array substrate 43b, which constitute the laminated body 43c, pressures are applied in a direction of the inside of the cell gap as shown in FIG. 9. Moreover, the pressurization chamber 2 is pressurized by driving the compressor 10 while maintaining the decompressed state of the decompression chamber 11 (S204 in FIG. 11 and FIG. 8). Then, a pressure is applied to the laminated body 43c from the outside through the sealing sheet 8 as shown in FIG. 9. The sealing sheet 8 is a partition wall partitioning the decompression chamber 11 and the pressurization chamber 2, and applies the pressure to the laminated body 43c. Hence, the sealing sheet 8 exerts a function as a diaphragm. Description has been made here for the example where the decompression of the decompression chamber 11 is started, and then the pressurization of the pressurization chamber 2 is started. However, it is satisfactory if the evacuation and the pressurization are simultaneously carried out, and an order of the starts does not matter. Hence, an order may be adopted, in which the pressurization chamber 2 is first pressurized, and the decompression chamber 11 is then decompressed. Alternatively, the decompression and the pressurization may be simultaneously started. Furthermore, the pressure to the pressurization chamber 2 may be properly selected from a range of 0 to 9 kgf/square cm, and the pressure in the decompression chamber 11 may be properly selected from a range of 0 to 0.9 kgf/square cm.

After passage of a specified time from the start of the decompression of the decompression chamber 11 and the pressurization of the pressurization chamber 2, the drives of the vacuum pump 5 and the compressor 10 are stopped to stop the evacuation and the pressurization (S205 in FIG. 11). After stopping the evacuation and the pressurization, the frame 6 is made to ascend by driving the cylinder 7. Thereafter, the laminated body 43c is taken out and subjected to the heating process as a curing process for the sealant Se. Specific contents of the heating process are similar to the above.

As described above, according to this embodiment, a pressure is applied from the outside to the laminated body 43c composed of the color filter 43a and the TFT array substrate 43b while decompressing the cell gap. Hence, as compared with those of the conventional method in which only decompression is performed for the cell gap, larger pressures can be applied to the color filter substrate 43a and the TFT array substrate 43b. Therefore, a desired micro cell gap can be readily obtained. Moreover, the air compressed in the cell gap does not expand after the release of the pressure as in the conventional method in which only a pressure from the outside is applied to the color filter substrate 43a and the TFT array substrate 43b. Therefore, the exfoliation of the sealant Se may not be worried about. Hence, these substrates are not required to be decompressed or pressurized during the curing process for the sealant Se.

In the above-described embodiment, description has been made for the example where the present invention is applied to the adjusting method of the gap width of the liquid crystal display panel 43. However, the present invention can be widely applied to articles in which gap widths are requested to be adjusted. Moreover, the pressuring method and the pressuring apparatus according to the present invention can be employed not only for the adjustment of the gap width but also for other purposes. Particularly, the present invention is suitable for applying pressures to a hollow article from the inside and the outside of a hollow portion thereof.

According to the present invention, there is provided a method capable of adjusting a micro gap width between a pair of substrates. When this adjusting method is applied to a manufacturing method of a display panel such as a liquid crystal display panel, a display panel with a gap width adjusted to a specified value is obtained. Thus, the adjusting method according to the present invention contributes to the improvement of the image quality.

Although the preferred embodiment of the present invention has been described in detail, it should be understood that various changes, substitutions and alternations can be made therein without departing from spirit and scope of the inventions as defined by the appended claims.

The invention claimed is:

1. A laminated body composed of first and second substrates and having a planar portion in combination with an apparatus for adjusting a gap width of the laminated body, comprising:
    an extendable cylinder;
    a frame attached to said extendable cylinder;
    a flexible film attached to said frame;
    a first chamber having a first closed space for accommodating said laminated body and provided with said flexible film adapted for contacting said planar portion of said laminated body, said first chamber comprising:
        a mounting stage for mounting said laminated body disposed below said flexible film, wherein said first closed space is formed by driving said extendable cylinder to descend said frame until the frame tightly contacts a surface of said mounting stage, and the elevation of said surface of said mounting stage is lower than the elevation of said planar portion of said laminated body;
    a second chamber having a closed space for enclosing said first chamber, said extendable cylinder and said frame;
    a decompressor for applying a decompression force to said first chamber; and
    a pressurizer for applying a pressurization force to said second chamber.

2. The apparatus of adjusting a gap width according to claim 1, wherein said pressurizer applies said pressurization force to said second chamber by introducing a pressurized fluid thereto, and said pressurization force is allowed to act on said laminated body through said flexible film.

3. The apparatus of adjusting a gap width according to claim 1, wherein said pressurization force is applied to said second chamber by said pressurizer while said decompression force is applied to said first chamber by said decompressor.

4. A laminated body in combination with an apparatus for adjusting a gap width of the laminated body, comprising:
    a pressurization chamber;
    a compressor connected to said pressurization chamber, wherein said pressurization chamber is pressurized by driving said compressor;
    a mounting stage located in said pressurization chamber for mounting said laminated body composed of a first substrate and a second substrate, said laminated body having a planar portion, said mounting stage having a penetration hole;
    an extendable cylinder located in said pressurization chamber and extending from a sidewall of said pressurization chamber towards said mounting stage;
    a box-shaped frame located in said pressurization chamber and attached to a lower end of said extendable cylinder, wherein said box-shaped frame has an opening facing towards said mounting stage;
    a flexible film located in said pressurization chamber and attached to a lower end surface of said box-shaped frame, wherein said flexible film is adapted for contacting said planar portion of said laminated body disposed below said flexible film;
    a decompression chamber formed as a closed space for accommodating said laminate body, wherein said closed space is formed by driving said extendable cylinder to descend said box-shaped frame until said box-shaped frame tightly contacts a surface of said mounting stage, and the elevation of said surface of said mounting stage is lower than the elevation of said planar portion of said laminated body, said pressurization chamber enclosing said decompression chamber; and
    a vacuum pump connected to said decompression chamber via said penetration hole.

5. The apparatus according to claim 4, wherein said compressor applies a pressurization force to said pressurization chamber by introducing a pressurized fluid thereto, and said pressurization force is allowed to act on said laminated body through said flexible film.

6. The apparatus of adjusting according to claim 4, wherein said pressurization force is applied to said pressurization chamber by said compressor while a decompression force is applied to said decompression chamber by said vacuum pump.

* * * * *